US 7,655,998 B2

(12) United States Patent
Oda

(10) Patent No.: US 7,655,998 B2
(45) Date of Patent: Feb. 2, 2010

(54) SINGLE PLATE SYSTEM COLOR SOLID-STATE IMAGE PICK-UP DEVICE HAS MICROLENSES IN RED PIXELS SET TO BE SMALLER THAN MICROLENSES IN GREEN PIXEL

(75) Inventor: Kazuya Oda, Asaka (JP)

(73) Assignee: Fujifilm Corporation, Tokyo (JP)

( * ) Notice: Subject to any disclaimer, the term of this patent is extended or adjusted under 35 U.S.C. 154(b) by 342 days.

(21) Appl. No.: 11/359,519

(22) Filed: Feb. 23, 2006

(65) Prior Publication Data

US 2006/0202932 A1 Sep. 14, 2006

(30) Foreign Application Priority Data

Feb. 24, 2005 (JP) ............ P. 2005-049292

(51) Int. Cl.
*H04N 3/14* (2006.01)
*H04N 5/335* (2006.01)
*H04N 9/04* (2006.01)
*H04N 5/225* (2006.01)
*H01L 29/80* (2006.01)
*H01L 31/112* (2006.01)
*G02B 27/10* (2006.01)

(52) U.S. Cl. .............. 257/432; 348/273; 348/272; 348/275; 348/340; 257/443; 257/257; 257/440; 257/228; 257/258; 359/619

(58) Field of Classification Search .............. 257/184, 257/440, 432, 443, 257, 228, 258; 359/619; 250/208.1, 226; 348/273, 272, 275, 340
See application file for complete search history.

(56) References Cited

U.S. PATENT DOCUMENTS

| 6,638,786 | B2 * | 10/2003 | Yamamoto | .......... 438/57 |
| 2002/0140832 | A1 * | 10/2002 | Summa | .......... 348/273 |
| 2004/0240081 | A1 * | 12/2004 | Saito | .......... 359/754 |

FOREIGN PATENT DOCUMENTS

| JP | 5-75085 A | 3/1993 |
| KR | 1020060077709 A * | 7/2006 |

* cited by examiner

*Primary Examiner*—Phat X Cao
*Assistant Examiner*—Diana C Garrity
(74) *Attorney, Agent, or Firm*—Birch, Stewart, Kolasch & Birch, LLP

(57) ABSTRACT

A single plate system color solid-state image pick-up device of a microlens loading type, the device comprising: a semiconductor substrate; a plurality of light receiving portions formed in a two-dimensional array in a surface portion of the semiconductor substrate; color filters each of which is for any of red, green and blue colors; and microlenses, wherein each of the color filters and each of the microlenses are laminated above on each of the light receiving portions, wherein first ones of the microlenses, corresponding to ones of the light receiving portions on which ones for the red color of the color filters are laminated, have smaller light receiving areas than those of second ones of the microlenses, corresponding to ones of the light receiving portions on which ones for the green color of the color filters are laminated.

10 Claims, 5 Drawing Sheets

G PIXEL

R PIXEL

SINGLE PLATE SYSTEM COLOR SOLID-STATE IMAGE PICK-UP DEVICE HAS MICROLENSES IN RED PIXELS SET TO BE SMALLER THAN MICROLENSES IN GREEN PIXEL

BACKGROUND OF THE INVENTION

1. Field of the Invention

The present invention relates to a single plate system color solid-state image pick-up device of a microlens loading type which is provided in an image input device such as a digital camera and more particularly to a single plate system color solid-state image pick-up device of a microlens loading type in which color shading is caused with difficulty and an image input device comprising the same.

2. Description of the Related Art

A single plate system solid-state image pick-up device of a CCD type or a CMOS type is loaded onto an image input device such as a digital camera. In the single plate system solid-state image pick-up device, a large number of pixels are arranged like a tetragonal lattice or a honeycomb, and a color filter for transmitting one of red (R), green (G) and blue (B) colors is laminated on each of the pixels. A microlens is loaded every pixel in such a manner that a light is efficiently incident on an opening of each pixel.

For example, in a solid-state image pick-up device described in JP-A-5-75085, a microlens is loaded every pixel, and furthermore, a shape of a corresponding microlens is changed for each color of a color filter depending on an angle of incidence from a lens optical system for collecting a light onto a tip surface of the solid-state image pick-up device onto each pixel, thereby compensating for a variation in a sensitivity unevenness generated by shading of the lens and changing a curvature of the microlens for each color of the color filter to compensate for a variation in the sensitivity unevenness.

In a recent solid-state image pick-up device, an increase in pixels has been developed and a dimension of one pixel has been reduced very greatly. For this reason, the influence of the shading of an incident light through an opening of a light receiving surface in a terminal portion of an incident optical path of each pixel (an opening of a shielding film) is greater than that of shading caused by the microlens provided on the entry of the incident optical path of each pixel. Consequently, there is a problem in that color shading is generated.

SUMMARY OF THE INVENTION

It is an object of the invention to provide a single plate system color solid-state image pick-up device of a microlens loading type which can suppress the generation of color shading and an image input device using the same.

The invention provides a single plate system color solid-state image pick-up device of a microlens loading type, the device comprising: a semiconductor substrate; a plurality of light receiving portions formed in a two-dimensional array in a surface portion of the semiconductor substrate; color filters each of which is for any of red, green and blue colors; and microlenses, wherein each of the color filters and each of the microlenses are laminated above on each of the light receiving portions, wherein first ones of the microlenses, corresponding to ones of the light receiving portions on which ones for the red color of the color filters are laminated, have smaller light receiving areas than those of second ones of the microlenses, corresponding to ones of the light receiving portions on which ones for the green color of the color filters are laminated.

The invention provides the single plate system color solid-state image pick-up device of a microlens loading type, wherein second light receiving areas of the second ones of the microlenses are set to be larger corresponding to a reduction in first light receiving areas of the first ones of the microlenses.

The invention provides the single plate system color solid-state image pick-up device of a microlens loading type, wherein, a light receiving area of one of the first ones of the microlenses is gradually reduced toward a peripheral part of the solid-state image pick-up device.

The invention provides the single plate system color solid-state image pick-up device of a microlens loading type, wherein when the color filters for at least two of red, green and blue colors are arranged to form a stripe pattern, ones of the microlenses, corresponding to ones, for a color having a longer color wavelength of a light to be transmitted, of the color filters, have smaller light receiving areas.

The invention provides an image input device comprising: any of the single plate system color solid-state image pick-up devices of a microlens loading type described above; and a signal processing section that corrects detection signals from ones of the light receiving portions, which detects an amount of an incident light having a red color, with first light receiving areas of the first ones of the microlenses.

DETAILED DESCRIPTION OF THE INVENTION

An embodiment of the invention will be described below with reference to the drawings.

Figure 1:
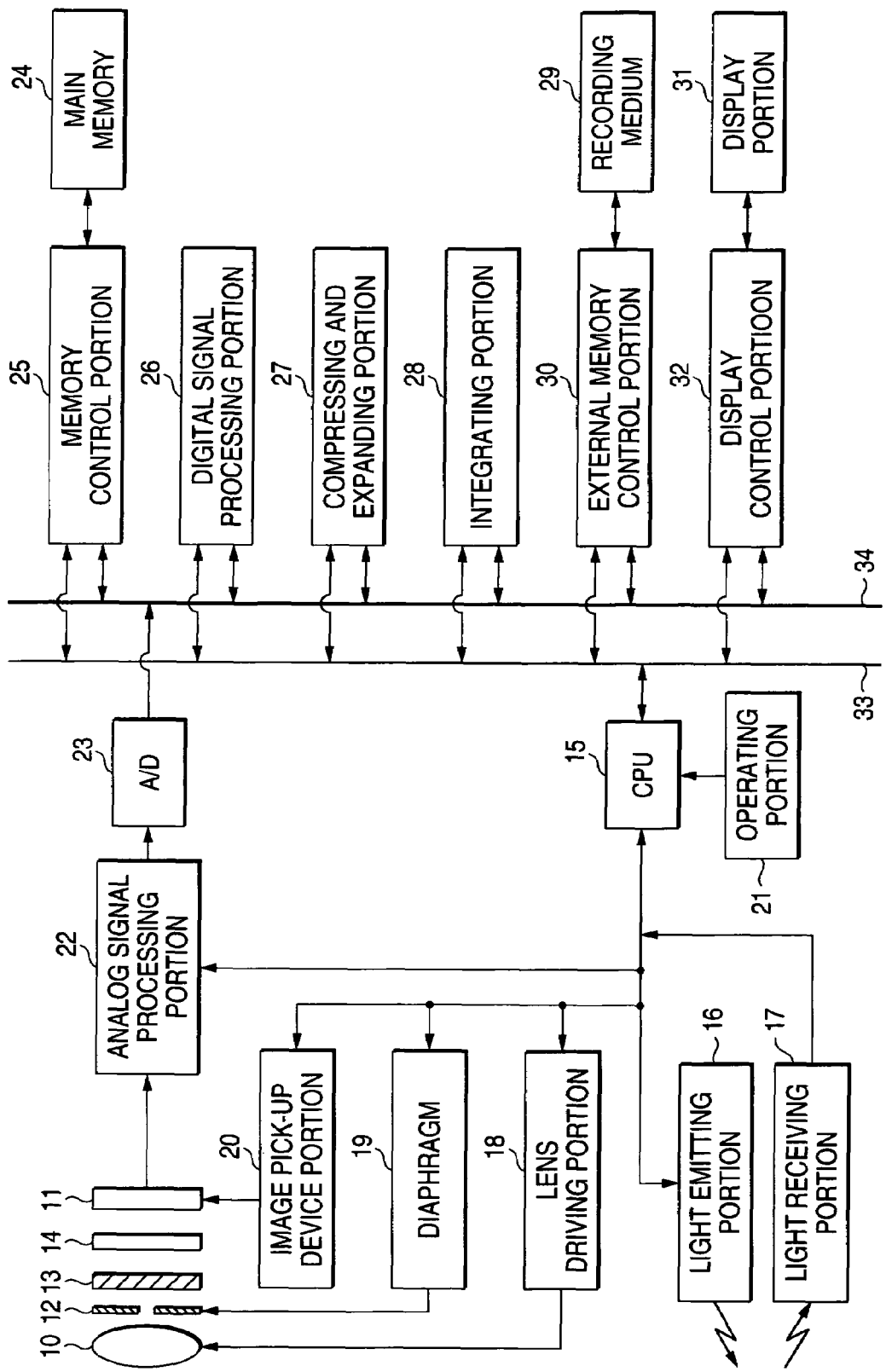
FIG. 1 is a block diagram showing a structure of a digital still camera according to an embodiment of the invention.

FIG. 1 is a diagram showing a structure of a digital still camera according to an embodiment of the invention which is an example of an image input device. While the description will be given by taking the digital still camera as an example in the embodiment, the invention can also be applied to a digital video camera, an electronic apparatus having a camera such as a cell phone having a camera and a scanner.

The digital still camera shown in FIG. 1 comprises a photographing lens 10 having a zoom function, a solid-state image pick-up device 11, a diaphragm 12 provided between both of them, an infrared cut filter 13, and an optical low-pass filter 14. A CPU 15 for controlling the whole digital still camera controls a light emitting unit 16 and a light receiving unit 17 for a flashlight, and furthermore, controls a lens driving unit 18 to adjust the zoom and focus positions of the photographing lens 10, and controls an opening amount of the diaphragm through a diaphragm driving portion 19 to adjust an amount of exposure so as to be proper.

Moreover, the CPU 15 drives the solid-state image pick-up device 11 through an image pick-up unit driving portion 20 and outputs, as a color signal, an object image picked up through the photographing lens 10. Moreover, a user instruction signal is input to the CPU 15 through an operating portion 21 and the CPU 15 carries out various control operations in accordance with the instruction.

An electric control system of the digital still camera includes an analog signal processing portion 22 connected to an output of the solid-state image pick-up device 11 and an A/D converting circuit 23 for converting color signals of RGB output from the analog signal processing portion 22 into digital signals, and these are controlled by the CPU 15.

Furthermore, the electric control system of the digital still camera includes a memory control portion 25 connected to a main memory (frame memory) 24, a digital signal processing portion 26, a compressing and expanding portion 27 for compressing a pick-up image into a JPEG image and expanding the compressed image, an integrating portion 28 for integrating photometric data and regulating a gain of a white balance, an external memory control portion 30 to which a removable recording medium 29 is connected, and a display control portion 32 to which a liquid crystal display portion 31 loaded onto a back face of the camera is connected, and these are connected mutually through a control bus 33 and a data bus 34 and are controlled in accordance with an instruction sent from the CPU 15.

Figure 2:
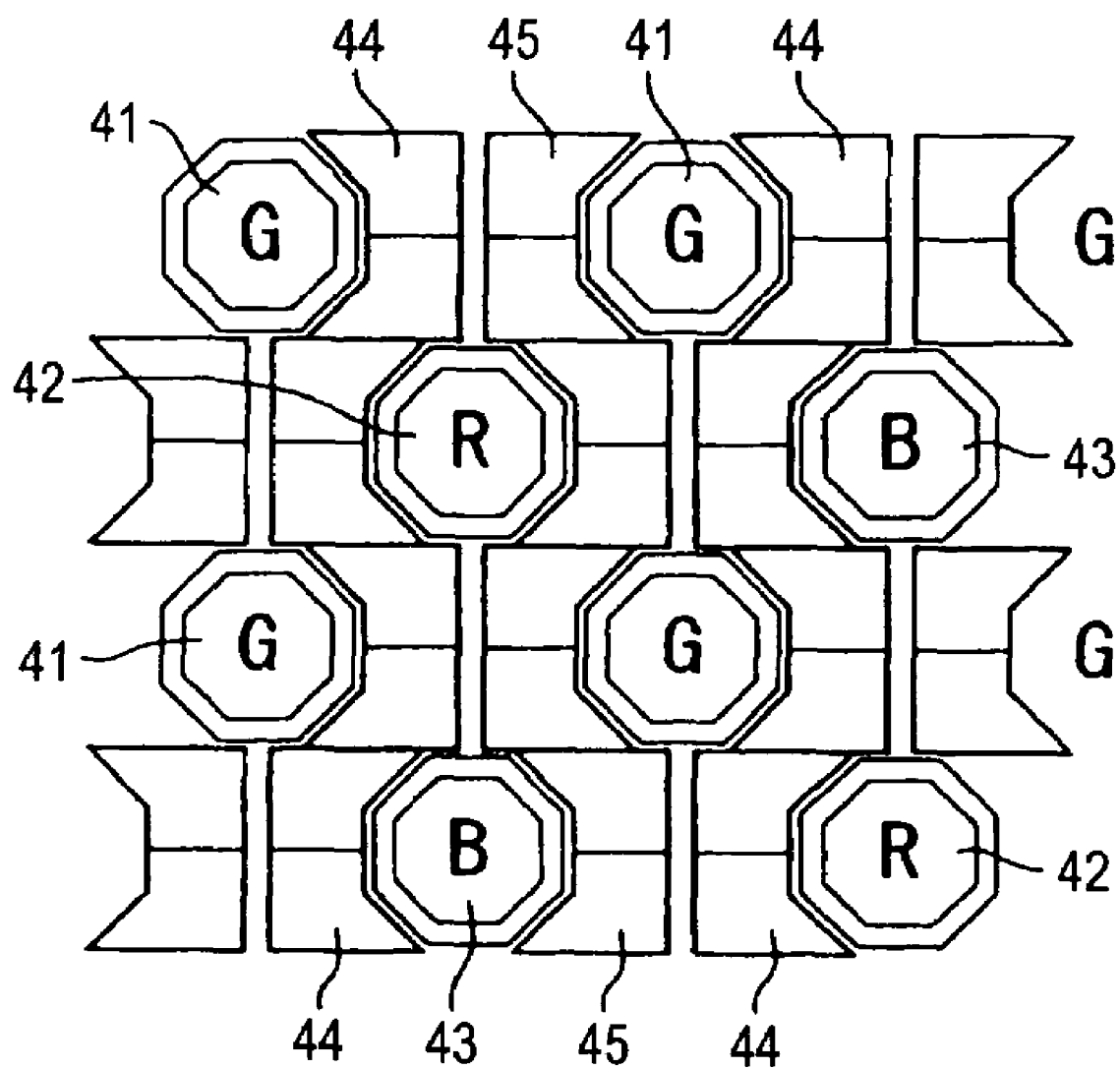
FIG. 2 is a typical view showing a surface of a solid-state image pick-up device illustrated in FIG. 1.

FIG. 2 is a typical view showing a surface of the solid-state image pick-up device 11 to be used in the embodiment. A row in which an R pixel 42 for detecting a red color (R) and a B pixel 43 for detecting a blue color (B) are alternately arranged is shifted from a row in which a G pixel 41 for detecting a green color (G) is arranged at a 1/2 pixel pitch in a horizontal direction (a so-called honeycomb pixel arrangement). Vertical transfer paths 44 and 45 for transferring signal charges read from the pixels 41, 42 and 43 in a vertical direction meander to keep away from the pixels 41, 42 and 43 in the vertical direction.

While the description will be given by taking, as an example, the solid-state image pick-up device 11 of a CCD type having the honeycomb pixel arrangement in the embodiment, the invention can also be applied to a solid-state image pick-up device of a CCD type having a tetragonal lattice array, and furthermore, the invention can be applied to a solid-state image pick-up device of an MOS type.

Figure 3:
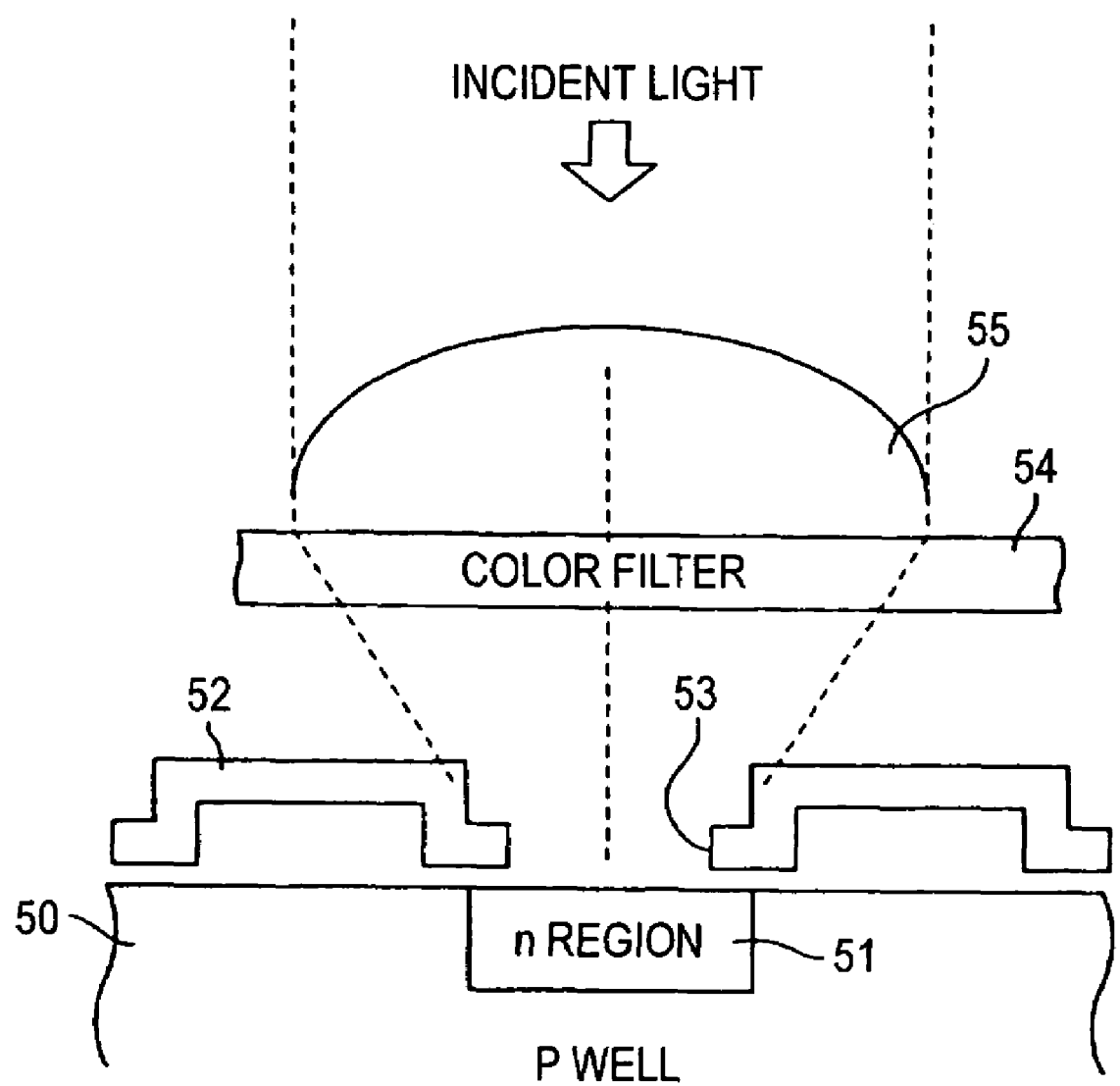
FIG. 3 is a typical sectional view corresponding to one pixel of the solid-state image pick-up device illustrated in FIG. 1.

FIG. 3 is a typical view showing sections of the pixels 41, 42 and 43. A P well layer 50 is formed in a surface portion of an n-type semiconductor substrate on which each of the pixels is provided, and an n region 51 is formed for each pixel in a surface portion of the P well layer 50. When a light is incident on the pn junction, a photoelectric charge is generated. The photoelectric charge is read onto the vertical transfer path 44 or 45 in FIG. 2 and is transferred to a horizontal transfer path which is not shown, and is then transferred to the horizontal transfer path and is read from the solid-state image pick-up device 11.

The P well layer 50 of the semiconductor substrate is covered with a shielding film 52 and an opening 53 is formed in a portion of the shielding film 52 which corresponds to a light receiving surface of each pixel. A color filter 54 is laminated on the shielding film 52 through a flattened layer, and a microlens 55 corresponding to each pixel is provided thereon through a flattened layer.

Figure 4:
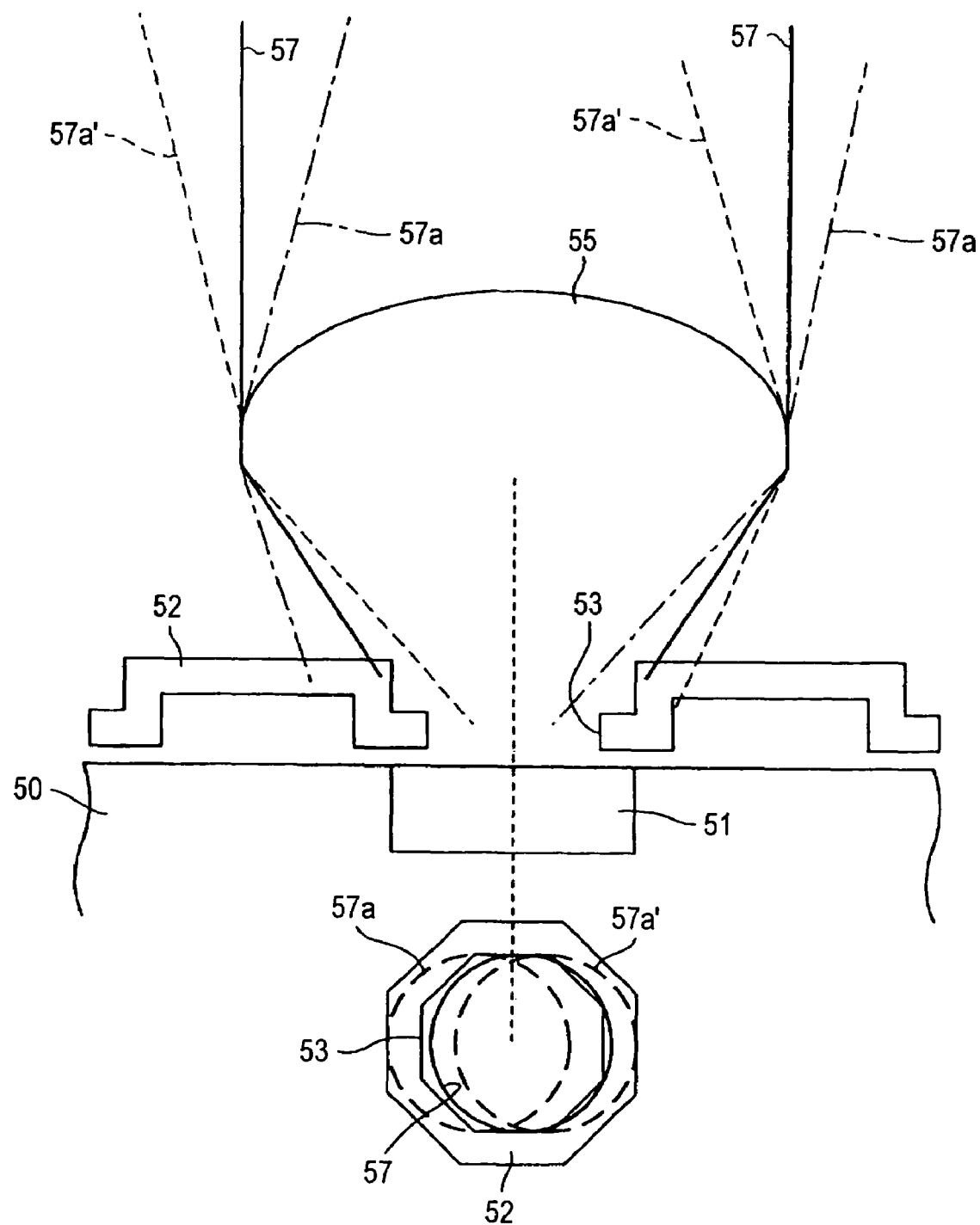
FIG. 4 is a view showing a relationship between an opening and a collecting point corresponding to one pixel of the solid-state image pick-up device illustrated in FIG. 1, and FIGS. 5A to 5C are views showing a difference between a G pixel and an R pixel in the solid-state image pick-up device illustrated in FIG. 1.

It is assumed that a light is incident perpendicularly to the substrate through the microlens 55 shown in FIG. 3. In this case, a collecting point 57 (which is not actually a "point" but is a surface having a larger diameter than a wavelength of the incident light) on which a light is collected by the microlens 55 is provided on an inside of the opening 53 as shown in FIG. 4. When an angle of incident is changed, however, collecting points 57a and 57a' get out of a center of the opening 53 as shown in FIG. 4. Consequently, a pixel light receiving portion provided under the opening 53 cannot receive a total amount of a light at the collecting point 57a but can receive only an amount of a light in the opening 53 at the collecting point 57a. So-called shading is generated.

When a zoom magnification of the photographing lens 10 shown in FIG. 1 is changed or the amount of the opening of the diaphragm 12 is regulated, a light is incident more obliquely for a closer pixel to a peripheral portion of the solid-state image pick-up device 11 so that the shading is caused by the opening 53 as described with reference to FIG. 4. A green light and a blue light are rarely influenced by the shading. When the shading is generated over a red light, however, color shading becomes conspicuous. For example, when an image of a gray object is picked up by the solid-state image pick-up device 11, a color of a pick-up image of a pixel in a peripheral portion of the image, that is, on a periphery of the solid-state image pick-up device 11 become slightly magenta or cyan, which is conspicuous.

Figure 5A:
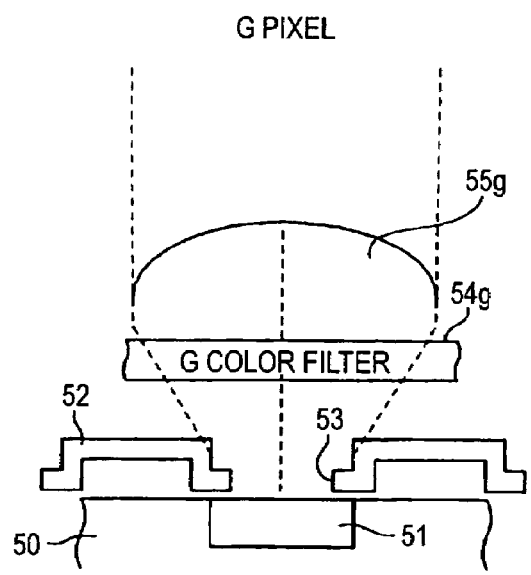
Figure 5B:
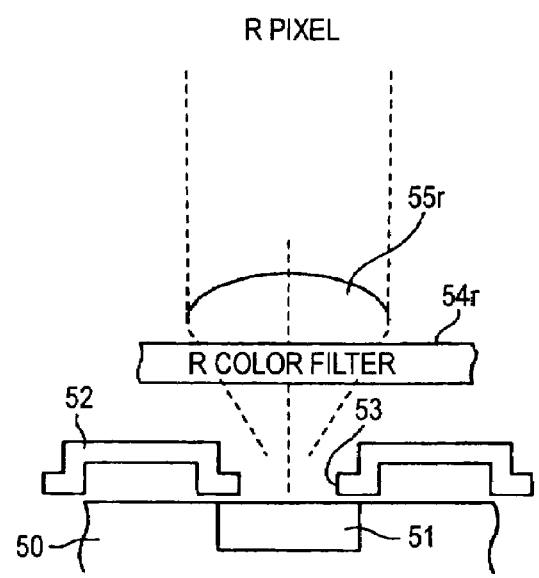
Figure 5C:
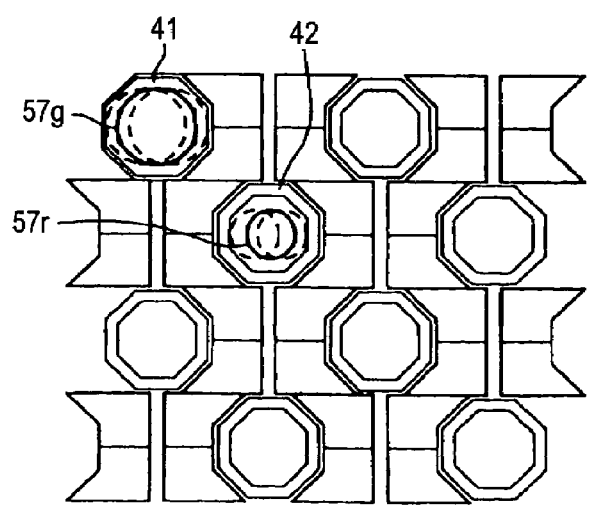

In the embodiment, therefore, a light receiving area of a microlens 55r provided in an R pixel 42 is set to be smaller than that of a microlens 55g provided in a G pixel 41 with an equal curvature maintained as shown in FIGS. 5A and 5B. Consequently, a diameter of a collecting point 57r in the R pixel 42 is smaller than that of a collecting point 57g in the G pixel 41, and the collecting point 57r for a red light is simply moved in the opening 53 even if the light is incident obliquely for a peripheral pixel of the solid-state image pick-up device 11 as shown in FIG. 5C. Thus, shading can be prevented from being caused by the opening 53 so that the generation of the color shading can be suppressed.

The light receiving area of the microlens 55r in the R pixel 42 is set to be small so that a sensitivity to a red light in the R pixel is lower than that to a green light in a G pixel and a blue light in a B pixel. However, a reduction in the sensitivity is caused by a decrease in the area of the microlens 55r. For this reason, the degree of the reduction in the sensitivity can be previously known in a design of the microlenses 55g and 55r. If the CPU 15 or the signal processing portions 22 and 26 shown in FIG. 1 maintain the reduction in the sensitivity as a default value, therefore, it is possible to carry out an image processing in consideration of a reduction in the sensitivity of the red color. In other words, a signal processing section such as the CPU 15 or the signal processing portions 22 and 26 has a function of correcting detection signals from the R pixels (serving as receiving portions), which detect an amount of an incident light having a red color, with (based on the information of) light receiving areas of plural microlenses 55r. Here, the signal processing section that performs the above-described function(s) is not limited to the above, and may also include a general purpose computer that are well-known in the art.

On the other hand, when unintentional shading for the red light is generated by the opening 53, it is impossible to know the degree of a reduction in the sensitivity which reflects the image processing. In the solid-state image pick-up device 11 according to the embodiment, however, it is possible to avoid the shading of the red light by the opening 53. Therefore, it is possible to obtain clear image data in which the color shading is suppressed.

While the microlenses 55r in all of the R pixels of the solid-state image pick-up device 11 are set to be smaller than the microlens 55g in the G pixel in the embodiment, a space is formed on a microlens forming layer corresponding to a reduction in the size of the microlens 55r. Therefore, it is also possible to correspondingly increase the size of the microlens 55g in the G pixel to be used for detecting a luminance. In this case, in a Bayer array or the color filter array shown in FIG. 2, it is preferable to reduce the size of the microlens in the B pixel to be equal to the size of the microlens 55*r* in the R pixel in order to form the microlens without a clearance over the microlens forming layer. Consequently, it is possible to cause the microlens 55*g* in the G pixel to be the largest.

Although the microlenses 55*r* in all of the R pixels of the solid-state image pick-up device 11 are set to be smaller than the microlens 55*g* in the G pixel in the embodiment, moreover, the light is incident obliquely on the peripheral pixels of the solid-state image pick-up device 11 and the degree of the oblique incidence is not great over pixels in a central part. By gradually reducing the area of the microlens 55*r* in the R pixel toward the periphery of the solid-state image pick-up device 11, therefore, it is also possible to cope with the color shading. Moreover, only the microlenses 55*r* of the R pixels in the peripheral portion may be set to have small areas and the microlenses 55*r* of the R pixels in the central part may be set to be the same as the microlens 55*g* of the G pixel.

In some cases in which a color filter is formed on the solid-state image pick-up device 11, a color filter for each color is formed in a vertical or lateral stripe in place of the Bayer array or the array in FIG. 2. Also in these cases, it is preferable to set a color filter for the R pixel to have a smaller area than a color filter for the G pixel in the same manner as in the embodiment.

Moreover, it is also possible to employ a structure in which the microlens has a smaller area for a color having a greater wavelength. More specifically, a wavelength is set to be R>G>B. Therefore, the area of the microlens may be set in order of B>G>R. Moreover, the sizes of the microlenses for the G and B pixels may be equal to each other and only the microlens for the R pixel may have a small area.

According to the invention, it is possible to prevent color shading from being generated by shading a red color on a pixel (a light receiving portion) in a peripheral region of the solid-state image pick-up device and to pick up an excellent color image.

The single plate system color solid-state image pick-up device of a microlens loading type according to the invention has an advantage that color shading can be suppressed, and is useful for an application to an image input device such as a digital camera or a scanner.

The entire disclosure of each and every foreign patent application from which the benefit of foreign priority has been claimed in the present application is incorporated herein by reference, as if fully set forth.

What is claimed is:

1. A single plate system color solid-state image pick-up device of a microlens loading type, the device comprising:
    a semiconductor substrate;
    a plurality of light receiving portions formed in a two-dimensional array in a surface portion of the semiconductor substrate;
    color filters each of which is for any of red, green and blue colors; and
    microlenses,
    wherein each of the color filters and each of the microlenses are laminated above on each of the light receiving portions,
    wherein first ones of the microlenses, corresponding to all of the light receiving portions on which the color filters for the red color are laminated, have smaller light receiving areas than those of second ones of the microlenses, corresponding to all of the light receiving portions on which the color filters for the green color are laminated.

2. The single plate system color solid-state image pick-up device of a microlens loading type according to claim 1, wherein second light receiving areas of the second ones of the microlenses are set to be larger corresponding to a reduction in first light receiving areas of the first ones of the microlenses.

3. The single plate system color solid-state image pick-up device of a microlens loading type according to claim 1, wherein, a light receiving area of one of the first ones of the microlenses is gradually reduced toward a peripheral part of the solid-state image pick-up device.

4. The single plate system color solid-state image pick-up device of a microlens loading type according to claim 1, wherein when the color filters for at least two of red, green and blue colors are arranged to form a stripe pattern, ones of the microlenses, corresponding to ones, for a color having a longer color wavelength of a light to be transmitted, of the color filters, have smaller light receiving areas.

5. An image input device comprising:
    the single plate system color solid-state image pick-up device of a microlens loading type according to claim 1; and
    a signal processing section that corrects detection signals from ones of the light receiving portions, which detects an amount of an incident light having a red color, with first light receiving areas of the first ones of the microlenses.

6. An image input device comprising:
    the single plate system color solid-state image pick-up device of a microlens loading type according to claim 1; and
    processing section means for correcting detection signals from ones of the light receiving portions, which detects an amount of an incident light having a red color, with first light receiving areas of the first ones of the microlenses.

7. The single plate system color solid-state image pick-up device of a microlens loading type according to claim 1, wherein first ones of the microlenses, corresponding to ones of the light receiving portions on which ones for the red color of the color filters are laminated, have a diameter of a collecting point smaller than those of second ones of the microlenses, corresponding to ones of the light receiving portions on which ones for the green color of the color filters are laminated.

8. The single plate system color solid-state image pick-up device of a microlens loading type according to claim 1, wherein the semiconductor substrate is covered with a shielding where an opening is formed in a portion of the shielding which corresponds to the light receiving areas of the first ones of the microlenses and the second ones of the microlenses.

9. The single plate system color solid-state image pick-up device of a microlens loading type according to claim 1, wherein first ones of the microlenses, corresponding to ones of the light receiving portions on which ones for the red color of the color filters are laminated, have smaller microlenses than those of second ones of the microlenses, corresponding to ones of the light receiving portions on which ones for the green color of the color filters are laminate.

10. The single plate system color solid-state image pick-up device of the microlens loading type according to claim 1, wherein
    the first ones of the microlens and the second ones of the mircolenses have an equal curvature.

* * * * *